United States Patent
Mineji

(10) Patent No.: US 7,259,075 B2
(45) Date of Patent: Aug. 21, 2007

(54) METHOD FOR MANUFACTURING FIELD EFFECT TRANSISTOR

(75) Inventor: Akira Mineji, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/225,187

(22) Filed: Sep. 14, 2005

(65) Prior Publication Data

US 2006/0199345 A1 Sep. 7, 2006

(30) Foreign Application Priority Data

Mar. 3, 2005 (JP) ............................. 2005-059554

(51) Int. Cl.
*H01L 21/336* (2006.01)
(52) U.S. Cl. .................... 438/303; 438/305; 438/530; 257/E21.453
(58) Field of Classification Search ................ 438/305, 438/306, 303, 530
See application file for complete search history.

(56) References Cited

U.S. PATENT DOCUMENTS

| 6,797,593 | B2* | 9/2004 | Chakravarthi et al. ...... 438/514 |
| 2004/0053457 | A1* | 3/2004 | Sohn .......................... 438/197 |
| 2004/0157469 | A1* | 8/2004 | Ito ............................. 438/759 |

FOREIGN PATENT DOCUMENTS

| JP | 2004-063574 | 2/2004 |
| JP | 2004-253446 | 9/2004 |

OTHER PUBLICATIONS

Akira Mineji et al., "Improvements of Electrical Properties with Reduced Transient-Enhanced-Diffusion for 65nm-node CMOS Technology using Flash Lamp Annealing", Extended Abstracts of the 2004 International Conference on Solid State Devices and Materials, Tokyo, pp. 412-413, Sep. 15, 2004.

* cited by examiner

*Primary Examiner*—Michael Trinh
(74) *Attorney, Agent, or Firm*—Young & Thompson

(57) ABSTRACT

The manufacturing stability can be improved while effectively inhibiting the short-channel effect in the transistor according to the present invention. A halo impurity having a conductivity type opposite to a first conductivity type of a first impurity is ion-implanted into the silicon substrate 101, and thereafter the first impurity having the first conductivity type, is ion-implanted and then a flash lamp annealing is conducted to form a p-type halo region 113 and a n-type extension region 111. Then, the second impurity having the first conductivity type is ion-implanted into the silicon substrate 101, and then a flash lamp annealing is conducted to form a n-type source/drain region 109. Then, the impurity contained in the silicon substrate 101 is activated via spike RTA.

10 Claims, 9 Drawing Sheets

METHOD FOR MANUFACTURING FIELD EFFECT TRANSISTOR

This application is based on Japanese patent application No. 2005-059554, the content of which is incorporated hereinto by reference.

BACKGROUND OF THE INVENTION

1. Field of the Invention

The present invention relates to a method for manufacturing a field effect transistor.

2. Description of the Related Art

In order to achieve more rapid operation of a field effect transistor, technological developments such as providing a very short gate length of the field effect transistor, providing a shallow source/drain region and the like are proceeded. Such technologies includes a technology described in Japanese Patent Laid-Open No. 2004-253,446.

Japanese Patent Laid-Open No. 2004-253,446 points out a fact that, in the process for manufacturing a metal oxide semiconductor (MOS) transistor, a redistribution is occurred as a diffusion of an implanted impurity is occurred during an annealing process after an ion implantation process, and therefore a dispersion of the impurity due to the redistribution of ions should be of achieving the considerably reduced gate length and/or providing the shallow source drain. It is also described that a transient enhanced diffusion (TED) becomes a problem in recent years as a factor for causing the redistribution corresponding to the diffusion of the implanted impurity, and that the TED is caused by a point defect created in the semiconductor substrate during the ion implantation process and is a phenomena, in which a redistribution of the impurity is occurred at a relatively lower temperature.

According to Japanese, Patent Laid-Open No. 2004-253, 446, it is described that a MOS transistor is obtained, which provides smaller variation of impurity profile in the source/drain region caused by a heat treatment in the process for forming side wall films of a gate electrode and involves inhibiting a diffusion of an impurity caused by the TED and the corresponding short-channel effect, by establishing an annealing temperature in consideration of a re-diffusion length characteristic for the impurity over the annealing temperature after the ion implantation process and by determining a sequential order of the ion implantation processes.

In addition, Japanese Patent Laid-Open No. 2004-63,574 describes the following approaches for providing a method for manufacturing a MOS transistor. According to Japanese Patent Laid-Open No. 2004-63,574, in the process for forming extension regions of the source/drain, after forming the shallow impurity ion-implanted region on a surface layer of a Si substrate, an annealing process is conducted in order to activate impurity ions in an impurity ion-implanted region. A flash lamp annealing process, which employs a flashlamp and is conducted at higher temperature with a short duration time, is described as an exemplary process of such type of annealing process.

It is also described that, when the source/drain region is formed, a two-step annealing process is conducted after a deep impurity-implanted region is formed in a surface layer of the Si substrate. First, a first heat treatment (pre annealing) is conducted via a rapid thermal annealing (RTA) employing a halogen lamp. Successively, a second thermal process is conducted by employing a Xe flashlamp. Such second heat treatment is a flash lamp annealing for activating an impurity-diffusing region.

SUMMARY OF THE INVENTION

However, the present inventor has examined the technology described in above-described Japanese Patent Laid-Open No. 2004-253,446, and found that there is a room for an improvement in view of providing a stable manufacture of the semiconductor device that involves better ability for inhibiting the short-channel effect in such type of MOS transistor.

In addition, in the technology described in Japanese Patent Laid-Open No. 2004-63,574, there is a room for an improvement in view of current-voltage characteristics of transistors.

The present inventor has eagerly investigated for providing a solution to the above-stated problem. As the result of the investigation, it is found that the manufacturing stability can be improved while effectively inhibiting the short-channel effect in the transistor, by eliminating the defects via the flash lamp annealing and separately conducting an activation via a spike RTA, thereby leading to the present invention.

According to one aspect of the present invention, there is provided a method for manufacturing a field effect transistor, comprising: forming a gate electrode on an element formation surface of a semiconductor substrate and providing a halo region and an extension region in regions of the semiconductor substrate being in vicinity of the gate electrode; after the providing the halo region and the extension region, providing a source/drain region in the semiconductor substrate; and after the providing the source/drain region, activating an impurity contained in an impurity-implanted region by heating the semiconductor substrate via a spike rapid thermal annealing (RTA), wherein the providing the halo region and the extension region includes a first ion implantation process that comprises ion-implanting a first impurity having a first conductivity type into the semiconductor substrate, and a first flash lamp annealing process that comprises flash lamp annealing the semiconductor substrate after the first ion implantation process, and wherein the providing the source/drain region includes a second ion implantation process that comprises ion-implanting a second impurity having the first conductivity type into the semiconductor substrate after the first flash lamp annealing process, and a second flash lamp annealing process that comprises flash lamp annealing the semiconductor substrate after the second ion implantation process.

In such method for manufacturing the field effect transistor, a flash lamp annealing is carried out after the ion implantation process in each of the processes for providing the halo region and the extension region and for providing the source/drain region.

Therefore, the first advantage is that a crystal defect in an impurity-doped region created by the ion implantation process can be eliminated before the process for providing the source/drain region during the process for forming the halo region and the extension region. Thus, a redistribution of the impurity that has been ion-implanted into the halo region and the extension region can be inhibited during a heat treatment process conducted after the process for forming the halo region and the extension region and more specifically during a heat treatment in the process for forming the side wall insulating film in the circumference of the gate electrode, for example. In addition, the crystal defect created in the ion implantation in the second ion implantation process can be definitely eliminated before the heat treatment process conducted after forming the source/drain region.

Thus, the redistribution of the impurity, which may be otherwise caused during the heat treatment due to a point defects created in the semiconductor substrate in the ion implantation process, can be inhibited. Therefore, the generation of the short-channel effect can be inhibited, even if the gate length of the transistor is reduced. As described above, according to the present invention, the reduction of a threshold voltage of the transistor can be inhibited by providing the flash lamp annealing process after each of the ion implantation processes and before the first heat treatment process.

Further, in the method for manufacturing the transistor according to the aspect of the present invention, the impurity doped into the semiconductor substrate is activated by heating the semiconductor substrate via the spike RTA after the flash lamp annealing process. Thus, the diffusion of the impurity can be suitably controlled in the activation process while effectively activating the impurity. Thus, in the aspect of the present invention, the defect created in the ion implantation process via the flash lamp annealing is eliminated and the impurity is activated via the spikes RTA, so that an inhibition to the reduction of the threshold voltage of the transistor can be achieved as the synergistic effect thereof, thereby effectively improving the characteristics for the use as the transistor. Further, such transistor can be stably manufactured.

In the present invention, a light source of broad wavelength range from optical to infrared region may be used for example. As for the spike RTA, a halogen lamp, which is the light source for the infrared region, may mainly be used and a length of an irradiation time may be on the order of several seconds. More specifically, about the optimum value in the present invention when represented by a temperature for heating a wafer, a duration time staying at the temperature of a peak temperature minus 100 degree C. is 1 second or more and 2 seconds or less. As for the flash lamp annealing, a light source being controlled the duration time thereof in the order of milliseconds may be used. As the light source, a Xe flash lamp may be used for example. In the FLA of the present invention, a length of an irradiation time may be several ten milliseconds and the optimum range thereof is 0.5 milliseconds or more and 10 milliseconds or less.

According to the present invention, the technology, which involves effectively inhibiting the short-channel effect of the field effect transistor to provide improvements in the characteristics for the use as the transistor, is achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Preferable embodiments according to the present invention will be described as follows in further detail, in reference to the annexed figures. In all figures, identical numeral is assigned to an element commonly appeared in the figures, and the detailed description thereof will not be presented.

First Embodiment

Figure 1:
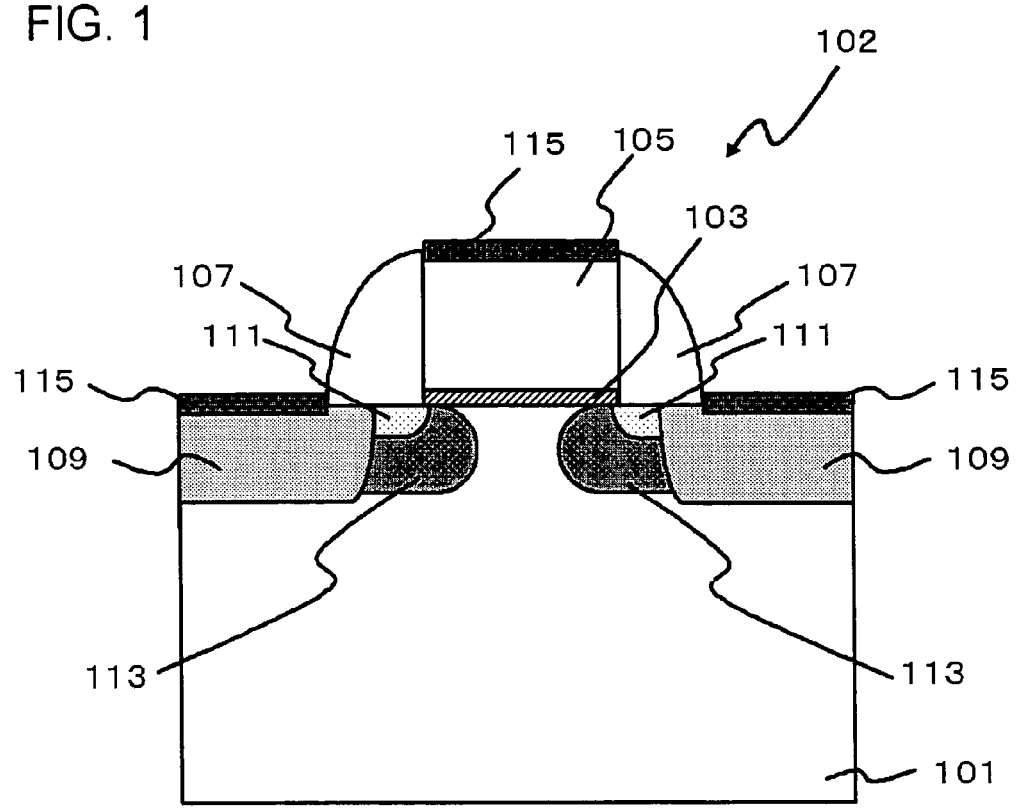
FIG. 1 is a cross-sectional view, showing a configuration of a semiconductor device in an embodiment of the present invention.

FIG. 1 is a cross-sectional view, schematically showing a configuration of a semiconductor device according to the present embodiment. A semiconductor device 100 shown in FIG. 1 comprises an n-type metal oxide semiconductor field effect transistor (MOSFET) 102. While it is not shown in FIG. 1, an element-separating region is provided in a peripheral portion of the n-type MOSFET 102.

In the n-type MOSFET 102, a pair of n-type source/drain regions 109 is provided in a silicon substrate 101 having p-type conductivity, and a channel region (not shown) is formed between the regions. The n-type source/drain region 109 is an impurity-diffusing region functioning as a source region or a drain region. A SiON film is provided on the channel region as a gate insulating film 103, and a polycrystalline silicon film that functions as a gate electrode 105 is formed on the SiON film so as to contacted therewith. Further, a side wall insulating film 107 that covers side walls of the gate insulating film 103 and the gate electrode 105 is provided. A Ni silicide layer 115 is provided on an upper portion of the gate electrode 105 and on a region of an upper portions of the n-type source/drain region 109 that has no side wall insulating film 107 formed thereon.

Next, a method for manufacturing the semiconductor device 100 shown in FIG. 1 will be described. The semiconductor device 100 is obtained by providing the n-type MOSFET 102 on the silicon substrate 101. FIG. 2A to FIG. 2C and FIG. 3A to FIG. 3C are cross-sectional views, illustrating a procedure for manufacturing the n-type MOSFET 102. FIG. 4 is a flow chart, showing a procedure for manufacturing the n-type MOSFET 102. The description will be made in reference to these drawings.

The method for manufacturing the n-type MOSFET 102 of the present embodiment comprises: forming a gate electrode 105 on an element formation surface of the semiconductor substrate (silicon substrate 101) and providing halo regions (p-type halo regions 113) and extension regions (n-type extension region 111) in portions of the silicon substrate 101 being in vicinity thereof (S101 to S103 in FIG. 4); after the process of providing the p-type halo region 113 and the n-type extension region 111, providing the source/drain region (n-type source/drain region 109) in the silicon substrate 101 (S104 and S105 in FIG. 4); and after the process of providing the n-type source/drain region 109, activating the impurity contained in an impurity-implanted region by heating the silicon substrate 101 via a spike RTA (S106 in FIG. 4). In addition, the method further comprises, after the process for activating the impurity, providing a silicide layer (Ni silicide layer 115) on the upper portion of the gate electrode 105 and the upper portion of the n-type source/drain region 109 (S107).

The process for providing the p-type halo region 113 and the n-type extension region 111 includes: a first ion implantation process that comprises ion-implanting a first impurity having a first conductivity type (n-type) into the silicon substrate 101 (S102 in FIG. 4); and a first flash lamp annealing process that comprises, after the first ion implantation process, flash lamp annealing the silicon substrate 101 (S103 in FIG. 4).

The process for providing the n-type source/drain region 109 includes: a second ion implantation process that comprises, after the first flash lamp annealing process (S103), ion-implanting a second impurity having the first conductivity type (n-type) into the silicon substrate 101 (S104 in FIG. 4); and a second flash lamp annealing process that comprises, after the second ion implantation process, flash lamp annealing the silicon substrate 101 (S105 in FIG. 4).

The process for activating the impurity contained in the impurity-implanted region by heating the silicon substrate 101 via the spike RTA (S106) includes elevating a temperature of the element formation surface at a rate of equal to or higher than 150 degree C./sec.

In addition, the process for activating the impurity contained in the impurity-implanted region by heating the silicon substrate 101 via the spike RTA (S106) also includes heating the element formation surface to a temperature of equal to or higher than 1,000 degree C.

The process for providing the p-type halo region 113 and the n-type extension region 111 includes ion-implanting a second conductivity type (p-type) impurity into the silicon substrate 101 (S101) before the first ion implantation process, and the process for activating the impurity contained in the impurity-implanted region by heating the silicon substrate 101 via the spike RTA (S106) includes activating the first conductivity type (n-type) impurity and the second conductivity type (p-type) impurity. Here, the second conductivity type is a conductivity type opposite to the first conductivity type.

The method for manufacturing the semiconductor device 100 having the n-type MOSFET 102 will be described more in detail as follows.

Figure 2A:
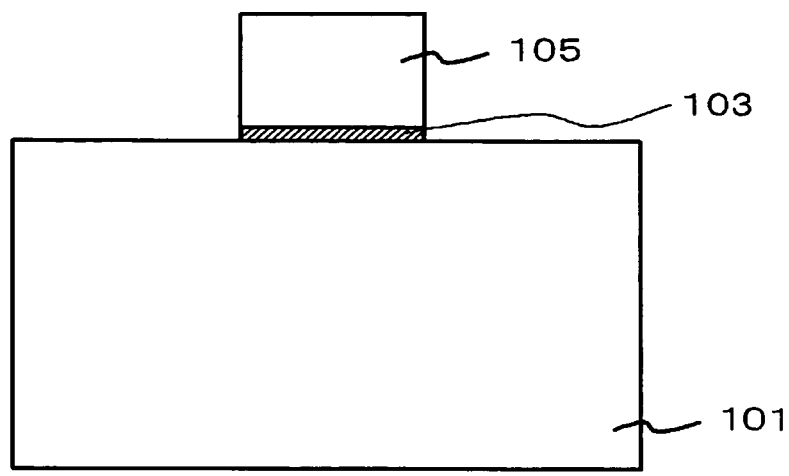
FIGS. 2A, 2B and 2C are cross-sectional views, illustrating a procedure for manufacturing the semiconductor device of FIG. 1.

First, as shown in FIG. 2A, an element separating region (not shown) of a shallow trench isolation (STI) is formed by employing a known technology on the silicon substrate 101 having a principal surface of, for example, (100) plane. The element separating region may be formed by another known method such as local oxidation of silicon (LOCOS). Then, a SiON film and a polycrystalline silicon film are sequentially deposited on the silicon substrate 101 to form a multiple-layered structure, and thereafter, the formed multiple-layered structure is selectively dry-etched to form a geometry for the gate insulating film 103 and the gate electrode 105. The SiON film is formed by, for example, a thermal oxidation and a plasma nitridation.

Figure 2B:
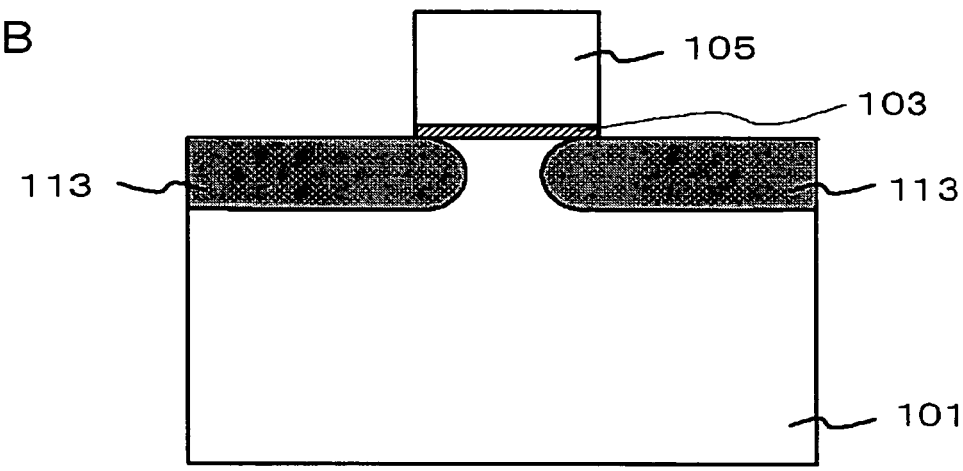

Next, a p-type halo region 113 is formed in a region of the silicon substrate 101 for forming the n-type MOSFET 102 (FIG. 2B). The p-type halo region 113 is provided in an end of the n-type source/drain region 109 in the lower part of the gate electrode 105, and is presented as an impurity-diffusing region for impurity having a conductivity type, which is same as that of the channel region. Since the p-type halo region 113 functions as a punch-through stopper region, the short-channel effect can be inhibited by providing the p-type halo region 113.

The p-type halo region 113 is, more specifically, formed by ion-implanting indium (In) therein through the gate electrode 105 as a mask under a condition of tilting the silicon substrate 101 by, for example, 30 degree from normal line to the surface of the silicon substrate 101 (tilt angle of 30 degree), while spinning the whole silicon substrate 101 (S101 in FIG. 4). The condition for the ion-implantation of In is, for example, at an energy of 60 keV and with a dose amount of $2 \times 10^{13}$ atoms/cm$^2$. Alternatively, boron (B) or an impurity containing boron such as bromine fluoride (BF2) and the like may be ion-implanted, in place of In.

Figure 2C:
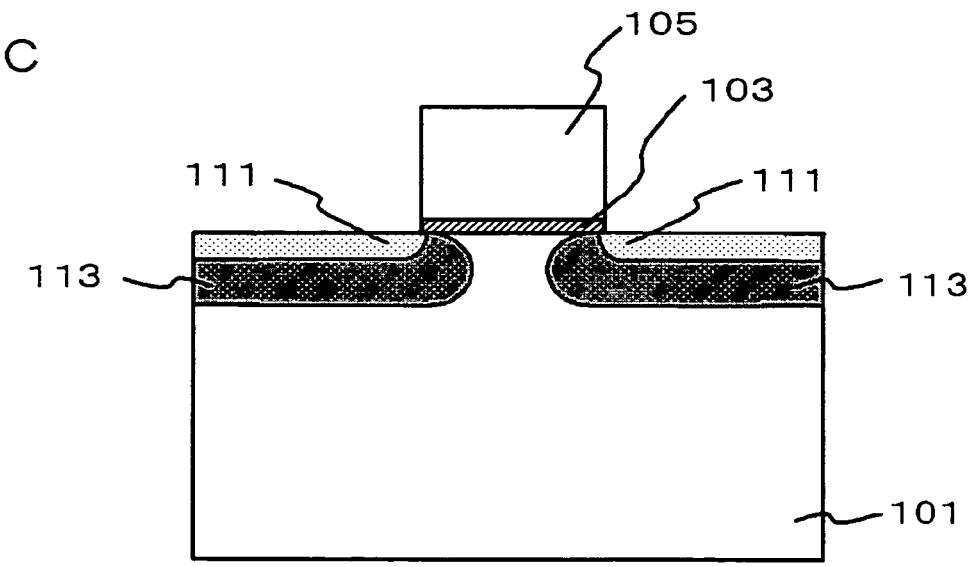

Subsequently, a n-type extension region 111, which functions as an electrical coupling between the channel region and the n-type source/drain region 109, is formed (FIG. 2C). More specifically, an ion-implantation with arsenic (As) is conducted along a direction that is parallel to normal line of the silicon substrate 101 (tilt angle: zero degree) through the gate electrode 105 as a mask under the condition of at an energy of 2 keV and with a dose amount of $5 \times 10^{14}$ atoms/cm$^2$ (S102 in FIG. 4). As a result, the p-type halo region 113 and the n-type extension region 111 are formed in a manner of self-aligning against the gate electrode 105.

Then, a flash lamp annealing (FLA) processes are conducted for the p-type halo region 113 that is ion-implanted or doped with In and for the n-type extension region 111 that is ion-implanted or doped with As, under the condition so that the silicon substrate 101 is not melted (S103 in FIG. 4). In this occasion, for example, the highest available temperature of the element formation surface of the silicon substrate 101 may be selected to a temperature level that does not cause melting of the silicon substrate 101. More specifically, the highest available temperature of the element formation surface of the silicon substrate 101 maybe selected to be, for example, lower than the melting point of silicon (Si) (1,412 degree C.). Having such configuration, the damage to the silicon substrate 101 in the FLA process can more be definitely inhibited.

Since the FLA process involves heating the entire surface of the silicon substrate 101, there is a concern that the silicon substrate 101 may be damaged if the heating temperature for the silicon substrate 101 is excessively high. On the other hand, there is also a concern that the elimination of the defects from the crystal lattice of Si created in the ion-implantation process can not be sufficiently achieved if the heating temperature is excessively low. Thus, in the present embodiment and the following embodiments, thermal conditions for heating the silicon substrate 101 in the FLA process, and more specifically the heating temperature, the heating duration time, and/or the energy provided to the silicon substrate 101 are suitably selected to provide predetermined conditions, based on the careful consideration of these concerns.

More specifically, such conditions for the FLA process include a condition that allows an effective elimination of the defects created in the p-type halo region 113 during the ion implantation process in step 101, and for example, a thermal condition that provides elevating the temperature of the portion of the silicon substrate 101 by a depth of 100 nm from the element formation surface thereof to 900 degree C. may be employed. More preferably, a thermal condition that provides elevating the temperature of the portion of the silicon substrate 101 at a depth deeper than the peak depth of the ion implantation in step 101 from the element formation surface of the silicon substrate 101 to 900 degree C. or higher may also be employed. Having such configuration, the lattice defects can be effectively eliminated through the whole p-type halo region 113 in the depth direction. Therefore, a decrease in the threshold voltage of the n-type MOSFET 102 can be more effectively prevented.

In addition, for example, the duration time for the FLA process may be on the order of several hundred or several ten milliseconds. More specifically, the duration time may be equal to or shorter than 100 milliseconds, and preferably equal to or shorter than ten milliseconds. Having such configuration, the lattice defects can be more stably eliminated.

Figure 3A:
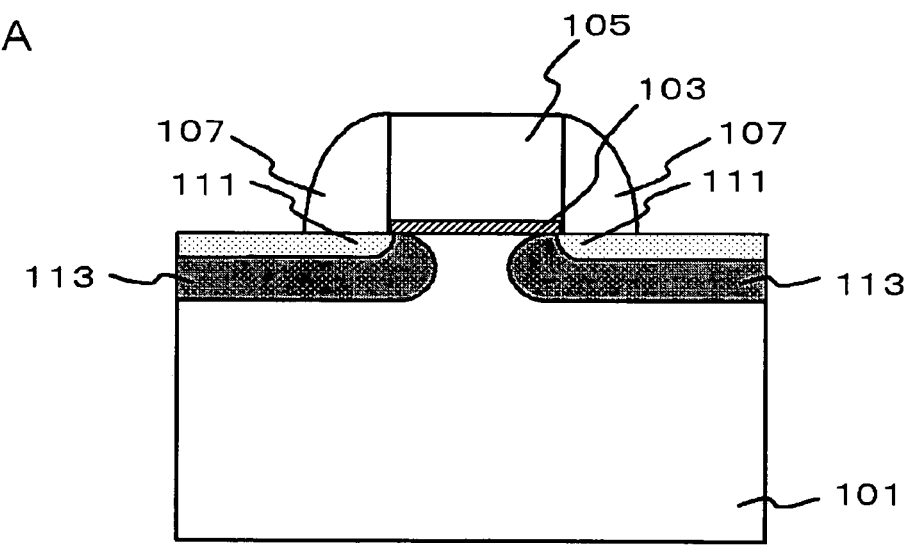
FIGS. 3A, 3B and 3C are cross-sectional views, illustrating a procedure for manufacturing the semiconductor device of FIG. 1.
Figure 4:
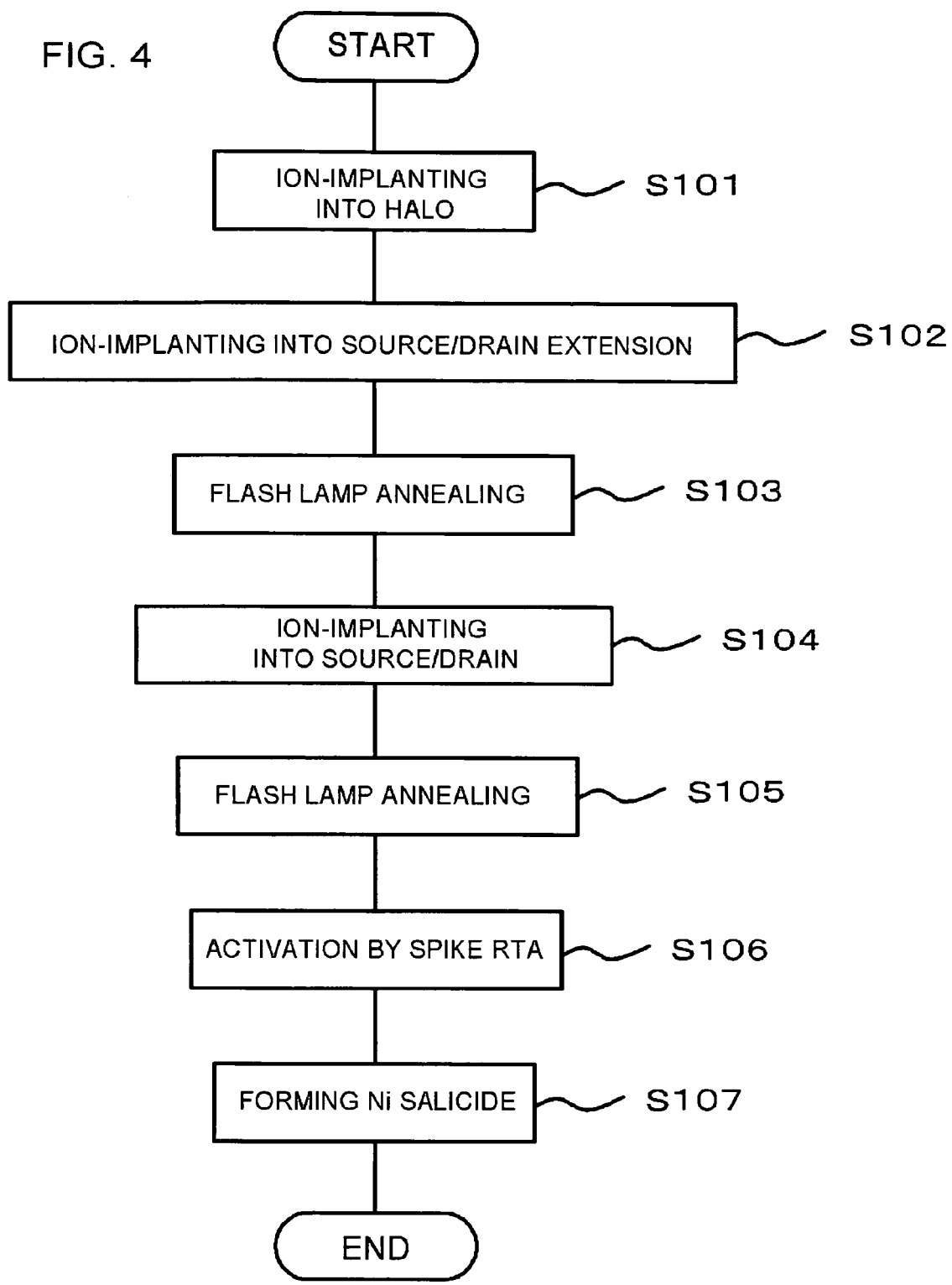
FIG. 4 is a flow chart, showing a procedure for manufacturing the semiconductor device in the embodiment of the present invention.

After the FLA is completed, a side wall insulating film 107 is formed on the side wall of the gate electrode 105 as shown in FIG. 3A. The side wall insulating film 107 is obtained by, for example, forming a silicon oxide film on the entire surface of the silicon substrate 101 via a chemical vapor deposition (CVD) and then conducting an etchback thereof. When the silicon oxide film is formed via the CVD, the silicon substrate 101 is heated to a temperature of around 500 to 600 degree C., for example.

Figure 3B:
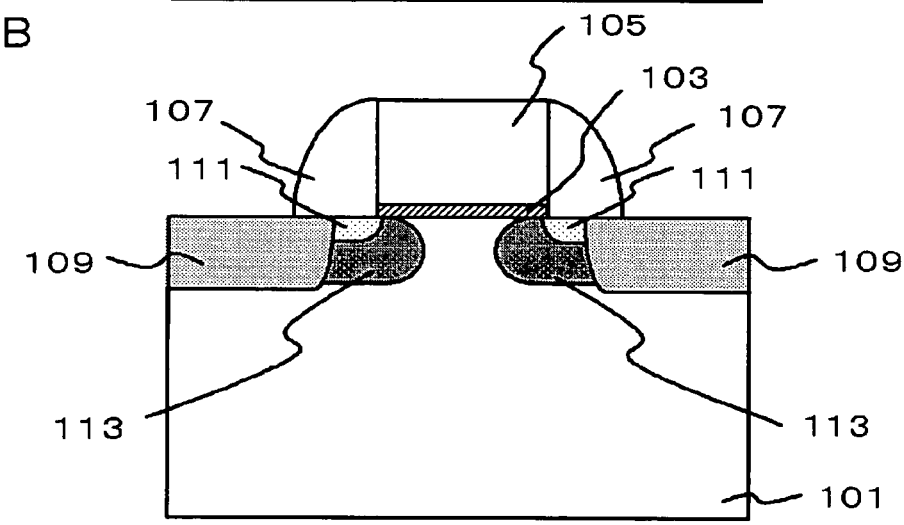

Then, the n-type source/drain region 109 is formed in a region for forming the n-type MOSFET 102 (FIG. 3B). The n-type source/drain region 109 is formed by ion-implanting a n-type impurity (S104 in FIG. 4). Arsenic (As) may be employed for the n-type impurity, for example, and the process conditions in this case may be, for example, at 25 keV and with $5 \times 10^{15}$ atoms/cm$^2$.

Subsequently, the FLA process for the n-type source/drain region 109 is conducted under the condition so that the silicon substrate 101 is not melted (S105 in FIG. 4). The condition of the FLA may be, for example, same as the annealing condition in the FLA of step 103 in FIG. 4.

Thereafter, the activation of impurity is conducted by thermally processing the silicon substrate 101 within a non-oxidizing atmosphere (S106 in FIG. 4). The impurity doped in the silicon substrate 101 is electrically activated by conducting such heat treatment. Although the condition for the heat treatment depends on the type of the doped impurity, an exemplary condition may be, for example, that a spike rapid thermal annealing (RTA) is employed to heat the silicon substrate 101 to a predetermined temperature, and thereafter, the temperature is immediately decreased. The highest available temperature of the surface of the silicon substrate 101 in the spike RTA process may be, for example, 1,000 degree C. Under such condition, the activation of the impurity ion-implanted in the silicon substrate 101 is ensured, and sufficient junction depth is fully ensured by allowing a suitable diffusion of impurity. In addition, the highest available temperature of the surface of the silicon substrate 101 may be equal to or lower than 1,100 degree C., for example. Under such condition, impurity doped into the silicon substrate 101 can be more stably activated. The highest available temperature of the silicon substrate 101 in the spike RTA process may be, more specifically, 1,050 degree C.

In addition, the heating rate in the spike RTA process may be, for example, equal to or higher than 150 degree C./sec., and preferably equal to or higher than 250 degree C./sec. This can further ensure the activation of the impurity.

Figure 3C:
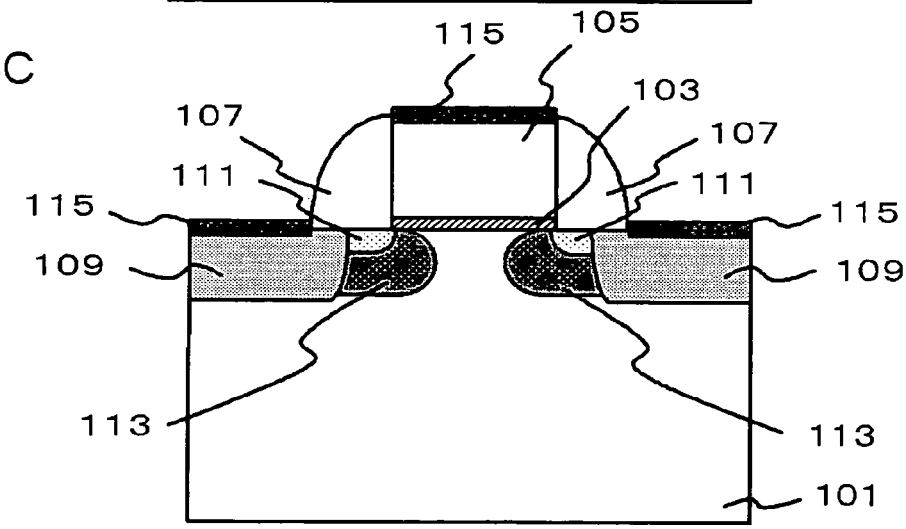

Then, a Ni salicide process is conducted (S107 in FIG. 4) to form a Ni silicide layer 115 on the upper portions of the gate electrode 105 and the n-type source/drain region 109 (FIG. 3C). A reduction in the resistance of the surfaces of the gate electrode 105 and the n-type source/drain region 109 can be achieved by providing the Ni silicide layer 115. Conventionally known methods may be employed for the formation of-the Ni silicide layer 115. For example, Ni is deposited on the entire surface of the element formation surface of the silicon substrate 101 by a sputtering, and thereafter, the annealing thereof is conducted at a cold temperature to form a meta-stable silicide. Then, unreacted residual Ni is removed by a wet process. Subsequently, an annealing is conducted at a predetermined temperature so that Ni is reacted with Si to form silicide. The semiconductor device 100 having the n-type MOSFET 102 (FIG. 1) is obtained by conducting the above-mentioned process.

Next, advantageous effects obtainable by employing the configuration of the semiconductor device 100 shown in FIG. 1 will be described. In the semiconductor device 100, the n-type MOSFET 102 is manufactured by conducting a FLA process (S103 and S105 in FIG. 4) as a process for eliminating defects created in the ion implantation process between the process for ion-implanting to the silicon substrate 101 and a heating process that is the earliest heating process conducted thereafter. More specifically, the FLA of step 103 is conducted after the ion implantation into the n-type extension region 111 in step 102 and before the heating process conducted during the process for forming the side wall insulating film 107. Further, after the ion implantation into the n-type source/drain region 109 in step 104 and before the annealing process for the activation in step 106, the FLA process of step 105 is conducted. In this way, the FLA processes are carried out for each of the ion implantation processes. Having such configuration, the diffusion of the impurity, which has been doped therein during each of the ion implantation processes, caused in the heat treatment process due to lattice defects created in each of the ion implantation processes can be inhibited, and the inhibition of the enhanced diffusion of the impurity in the activation annealing process (S106 in FIG. 4) can also be inhibited. Thus, the generation of the short-channel effect can be inhibited even in the case of having a configuration comprising the miniaturized gate electrode 105 and side wall insulating film 107, or in other words in the case of having a configuration that the gate length of the n-type MOSFET 102 is short. Therefore, the configuration that provides inhibiting the decrease of the threshold voltage of the n-type MOSFET 102 and provides better characteristics for the use as the transistor can be presented.

Here, in Japanese Patent Laid-Open No. 2004-63,574 described above in the description of the related art, it is described that a flash lamp annealing, which is served as both the defect-eliminating process and the activating process, can be carried out in each of the shallow ion-implanted layer and the deep ion-implanted layer, after the ion-implanted layers are formed. However, in such case, there is a concern that the transistor characteristics can not be fully ensured, since the level of the conjunction of the diffusion layers is too shallow, due to the shorter heating time for the silicon substrate 101.

To provide a solution thereto, the present embodiment provides respective FLA processes after forming the n-type extension region 111 and after forming the n-type source/drain region 109, so that the diffusion of the impurity and remaining of the lattice defect are inhibited, and further, separate activation processes (S106 in FIG. 4) are provided after each of the FLAs, so that the activation via the spike RTA is conducted. Having such configuration, a predetermined region is selectively heated to eliminate a crystal defect in step 103 and step 105, and the entire surface of the silicon substrate 101 is heated in step 106 to definitely activate the impurity and suitably diffuse the impurity, so that an appropriate junction depth can be ensured and the conjunction that is not very shallow can be provided.

As described above, in the present embodiment, characteristics as the transistor such as the threshold voltage of the n-type MOSFET 102, the electrical voltage-current characteristics and the like can be considerably improved by a synergistic effect of the elimination of the defect from the crystal lattice of Si via the FLA and the control of the diffusion of the impurity via the spike RTA.

In a following embodiment, different points from first embodiment will be mainly described.

Second Embodiment

While the example of the semiconductor device 100 having the n-type MOSFET 102 is described in the first embodiment, a configuration of the present invention may also be applied to a complementary metal oxide semiconductor field effect transistor (CMOSFET).

Figure 5:
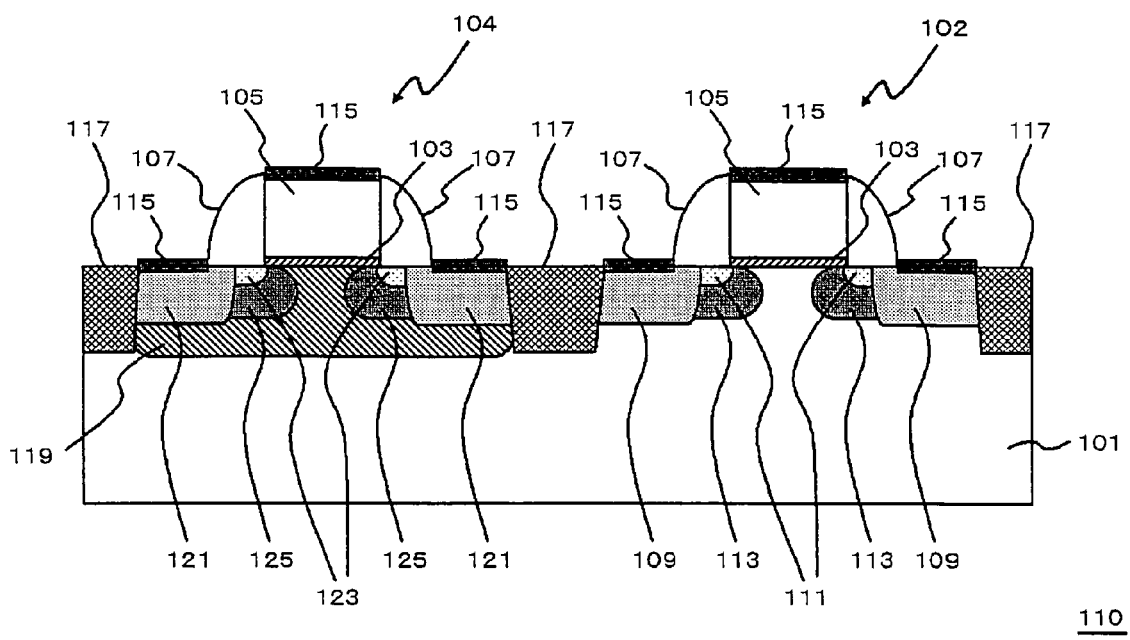
FIG. 5 is a cross-sectional view, showing a configuration of a semiconductor device in another embodiment of the present invention.

FIG. 5 is a cross-sectional view, illustrating a configuration of a semiconductor device of the present embodiment. A semiconductor device 110 shown in FIG. 5 comprises a CMOSFET composed of the n-type MOSFET 102 shown in FIG. 1 and a p-type MOSFET 104.

The p-type MOSFET 104 is physically isolated and electrically insulated from the n-type MOSFET 102 by an element separating region 117. The p-type MOSFET 104 is formed in a n-type well 119 provided in the silicon substrate 101. The p-type MOSFET 104 also comprises a n-type halo region 125, a p-type extension region 123 and a p-type source/drain region 121, in place of the n-type source/drain region 109 of the n-type MOSFET 102, the n-type extension region 111 and the p-type halo region 113, respectively.

FIG. 6A to FIG. 6C and FIG. 7A to FIG. 7C are cross-sectional views, illustrating a process for manufacturing the semiconductor device 110 shown in FIG. 5. The process for manufacturing the semiconductor device 110 will be described as below in reference to these drawings.

Figure 6A:
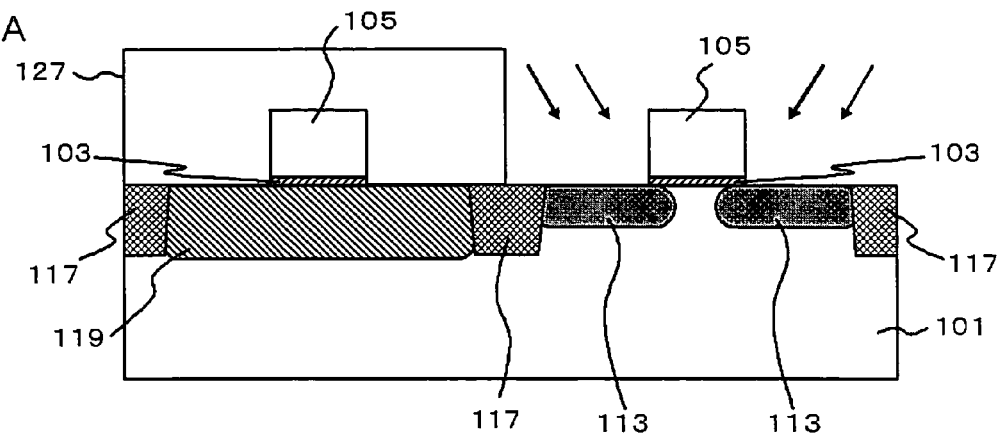
FIGS. 6A, 6B and 6C are cross-sectional views, illustrating a procedure for manufacturing the semiconductor device of FIG. 5.
Figure 6B:
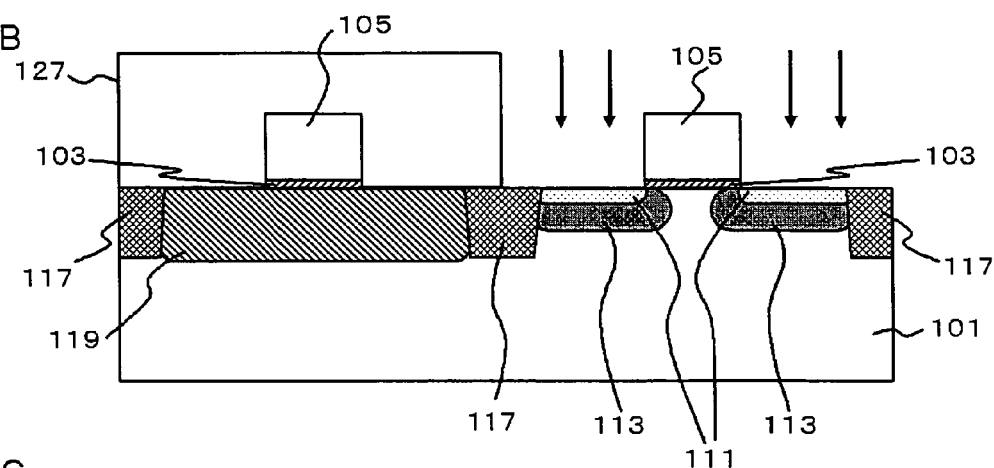

First, as shown in FIG. 6A, the element separating region 117, which isolates the n-type MOSFET 102 from the p-type MOSFET 104, is formed in the p-type silicon substrate 101. The element separating region 117 maybe, for example, a STI formed by a known method, similarly as in the first embodiment. Then, the region for forming the p-type MOSFET 104 is doped or ion-implanted with phosphorus (P) as a n-type impurity to form a n-type well 119. Subsequently, similarly as in the first embodiment, a gate insulating films 103 and a gate electrodes 105 are formed in the regions for forming the n-type MOSFET 102 and the p-type MOSFET 104, respectively.

Then, the region for forming the p-type MOSFET 104 is covered with a mask 127, and the p-type halo region 113 is formed (FIG. 6A) similarly as in the first embodiment (FIG. 2B). Further, a n-type extension region 111 is formed (FIG. 6B), similarly as in the first embodiment (FIG. 2C).

Figure 6C:
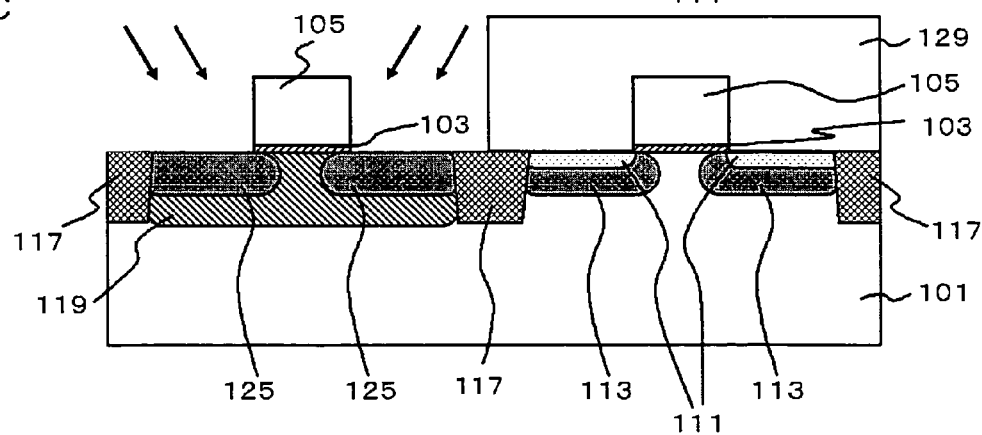

Subsequently, the mask 127 is stripped, and thereafter, the region for forming the n-type MOSFET 102 is covered with a mask 129. Then, a n-type halo region 125 is formed in the region for forming the p-type MOSFET 104 (FIG. 6C). More specifically, the n-type halo region 125 is formed by ion-implanting arsenic (As) through the gate electrode 105 as a mask, while tilting the silicon substrate 101 by, for example, 30 degree from normal line direction of the silicon substrate 101 (tilt angle: 30 degrees). The conditions for the ion-implantation of As is, for example, at an energy of 45 keV and with a dose amount of $2 \times 10^{13}$ atoms/cm$^2$. Alternatively, phosphorus (P) may be ion-implanted, in place of As.

Figure 7A:
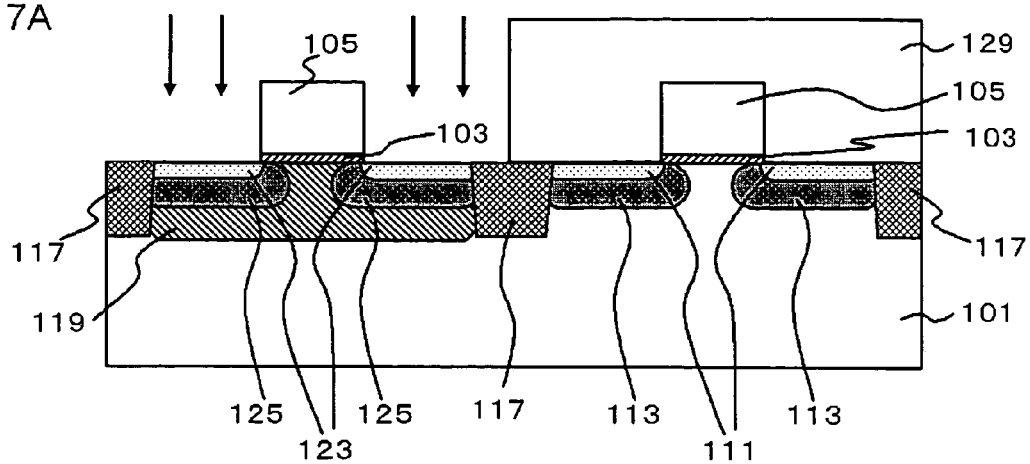
FIGS. 7A, 7B and 7C are cross-sectional views, illustrating a procedure for manufacturing the semiconductor device of FIG. 5.

Then, a p-type extension region 123 is formed while maintaining the status of covering the region for forming the n-type MOSFET 102 with the mask 129 (FIG. 7A). More specifically, an ion-implantation with boron fluoride (BF2) is conducted along a direction that is parallel to the normal line of the surface of the silicon substrate 101 (tilt angle: zero degree) through the gate electrode 105 as a mask, under the condition of at an energy of 2 keV and with a dose amount of $5 \times 10^{14}$ atoms/cm$^2$.

As a result thereof, the p-type extension region 123 and a n-type halo region 125 are formed in a manner of self-aligning against the gate electrode 105. Here, the impurity for the ion-implanting may be boron, in place of boron fluoride.

Next, the mask 129 is stripped, and then, the FLA process for eliminating the lattice defects from the n-type extension region 111, the p-type halo region 113, the p-type extension region 123 and n-type halo region 125 in the silicon substrate 101 is conducted under the condition so that the silicon substrate 101 is not melted (S103 in FIG. 4). Process conditions for the FLA may be, for example, the condition same as employed in the first embodiment.

Figure 7B:
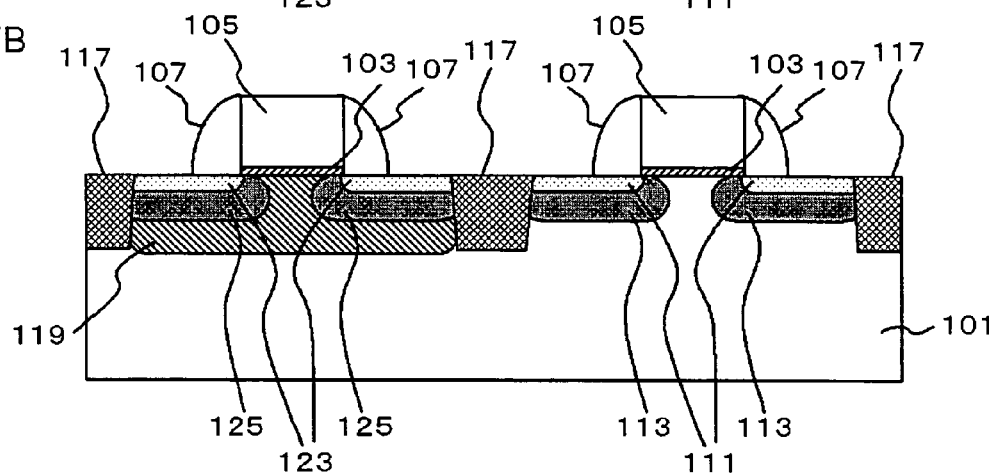

After conducting the FLA process, a side wall insulating film 107 is formed on the side wall of the gate electrode 105, as shown in FIG. 7B. The formation of the side wall insulating film 107 may be carried out by, for example, the procedure described above in reference to FIG. 3A.

Figure 7C:
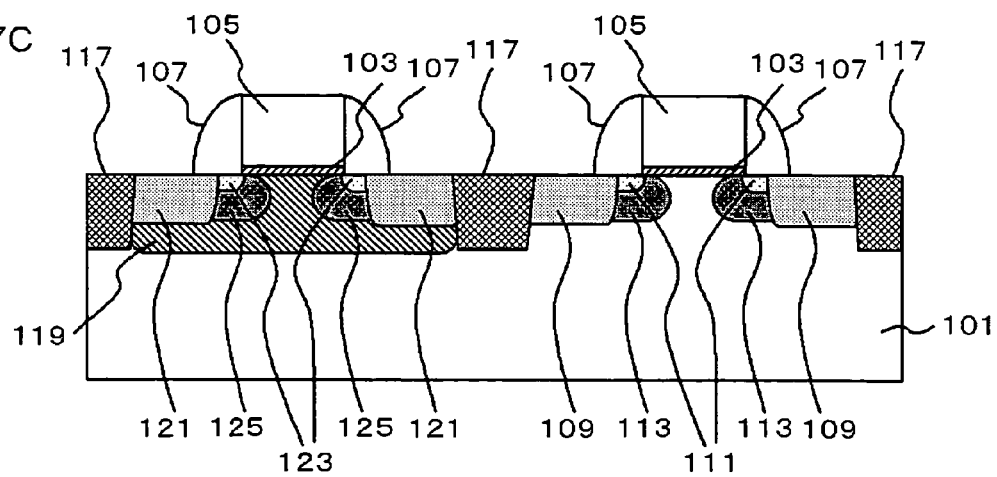

Then, the region for forming the p-type MOSFET 104 is covered with a mask (not shown), and the ion-implanting into the region for forming the n-type MOSFET 102 is conducted to form the n-type source/drain region 109. In addition, the region for forming the n-type MOSFET 102 is covered with a mask (not shown), and the ion-implanting into the region for forming the p-type MOSFET 104 is conducted to form the p-type source/drain region 121 (FIG. 7C). Here, boron (B) for example, is employed as a p-type impurity for ion-implanting into the region for forming the p-type source/drain region 121. Process conditions for the implantation may be, for example, at 2 keV and with $5 \times 10^{15}$ atoms/cm$^2$.

Thereafter, the FLA process for the n-type source/drain region 109 and the p-type source/drain region 121 is conducted under the condition that the silicon substrate 101 is not melted (S105 in FIG. 4). Process conditions of the FLA may be, for example, same as the annealing condition in the first embodiment.

Thereafter, similarly as in the first embodiment, the spike RTA process is conducted within a non-oxidizing atmosphere to activate the impurity that has been ion-implanted into silicon substrate 101 (S106 in FIG. 4). Then a Ni silicide layer 115 is formed on upper portions of the gate electrode 105, the n-type source/drain region 109 and the p-type source/drain region 121. According to the above-described process, the semiconductor device 110 having the n-type MOSFET 102 and the p-type MOSFET 104 (FIG. 5) is obtained.

The semiconductor device 110 of the present embodiment is manufactured by conducting the FLA process after forming the halo region and the extension region of the n-type MOSFET 102 and the p-type MOSFET 104 and before conducting the heating process (S103 in FIG. 4), and by conducting the FLA process after forming the source/drain region and before conducting the activation process that is the earliest heat-treatment process (S105 in FIG. 4). Thus, the defect-recovery effect same as obtained in the first embodiment can be obtained, and a generation of a contamination material during the manufacturing process in each of the n-type MOSFET 102 and the p-type MOSFET 104 composing the CMOSFET is inhibited. Thus, in each of the n-type MOSFET 102 and the p-type MOSFET 104, the short-channel effect in inhibited.

EXAMPLES

In the following experiments, first, a p-type MOSFET, which is obtainable by a manufacturing procedure that is a partially modified version of the procedure for manufacturing the p-type MOSFET 104 (FIG. 5) and the p-type MOSFET 104 in the semiconductor device 110 described in the second embodiment, is manufactured.

Example 1

A p-type MOSFET 104 was manufactured via the procedure shown in FIG. 4. In step 103 and step 105 of FIG. 4, the highest available temperature of the surface of the silicon substrate 101 was set to 1,300 degree C. Here, in this example and the following examples, the heating temperature during the formation of the side wall insulating film 107 was 700 degree C. In addition, in the spike RTA of step 106, a heating rate was set to 250 degree C./sec., and highest available temperature of the surface of the silicon substrate 101 was set to 1,050 degree C.

Example 2

A p-type MOSFET was manufactured by a process, in which the annealing processes of step 103 and step 105 were substituted with the FLA processes in the procedure shown in FIG. 4 to conduct a spike RTA process. The highest available temperature in the spike RTA was set to 1,300 degree C.

(Analysis 1)

Figure 8:
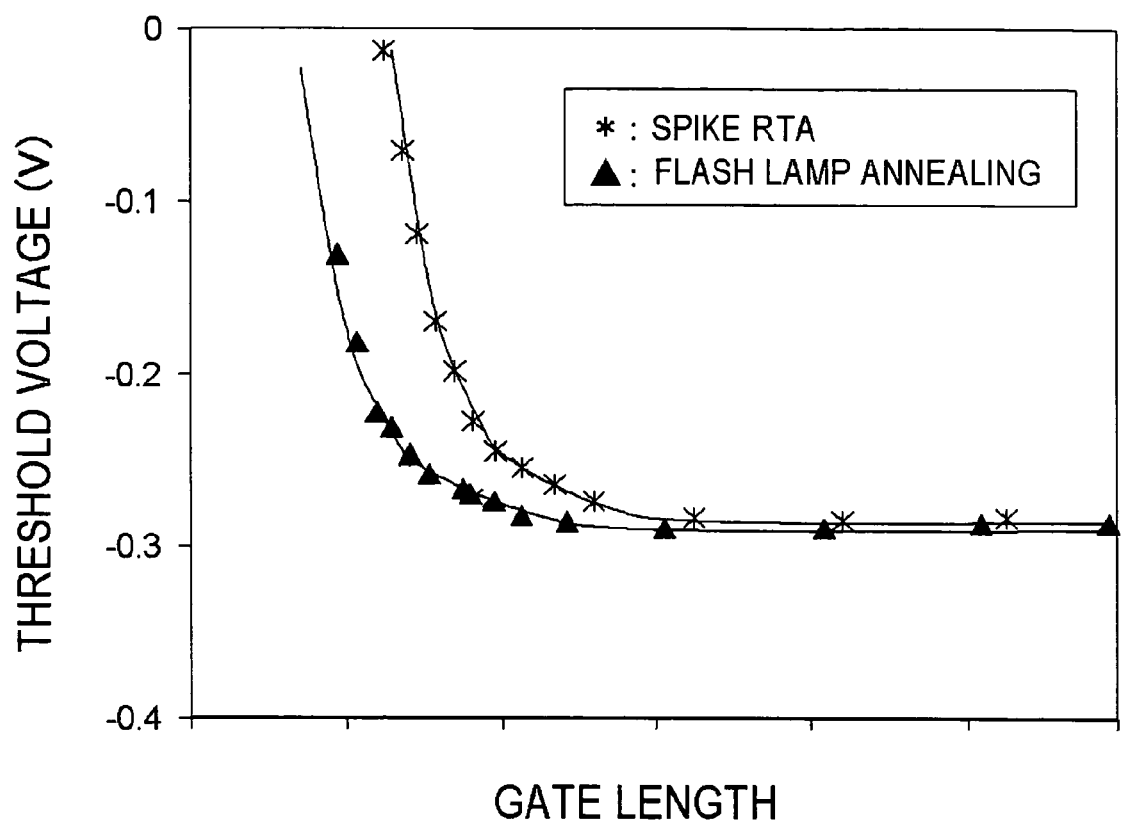
FIG. 8 is a graph, showing a relationship of the gate length with the threshold voltage of the p-type MOSFETs in examples.

The relationship of the gate length (nm) with the threshold electrical voltage (V) was investigated for the p-type MOSFETs obtained in the example 1 and the example 2. As a result thereof, FIG. 8 is a graph, showing a relationship of the gate length (nm) with the threshold voltage (V) of the p-type MOSFET. According to FIG. 8, in the case of the p-type MOSFET 104 obtained in example 1, the threshold voltage characteristics could be considerably improved by including the FLA process as the defect-eliminating process, as compared with the p-type MOSFET obtained in example 2.

Next, the n-type MOSFET 102 in the semiconductor device 100 described in the first embodiment and a n-type MOSFET, which is obtainable by a manufacturing procedure that is a partially modified version of the procedure for manufacturing the n-type MOSFET 102 (FIG. 1), were manufactured.

Example 3

A n-type MOSFET 102 was manufactured by the procedure shown in FIG. 4. In step 103 and step 105 of FIG. 4, the highest available temperature of the surface of the silicon substrate 101 was set to 1,300 degree C. Here, in this example and the following examples, the heating temperature during the formation of the side wall insulating film 107 was 700 degree C. In addition, in the spike RTA of step 106, a heating rate was 250 degree C./sec., and highest available temperature of the surface of the silicon substrate 101 was 1,050 degree C.

Example 4

A n-type MOSFET was manufactured by the procedures shown in FIG. 4, except that the activation by the spike RTA of step 106 was not conducted.

Example 5

A n-type MOSFET was manufactured by a procedure that is generally equivalent to that shown in FIG. 4, except that the FLA processes of step 103 and step 105 were not conducted.

(Analysis 2)

Figure 9:
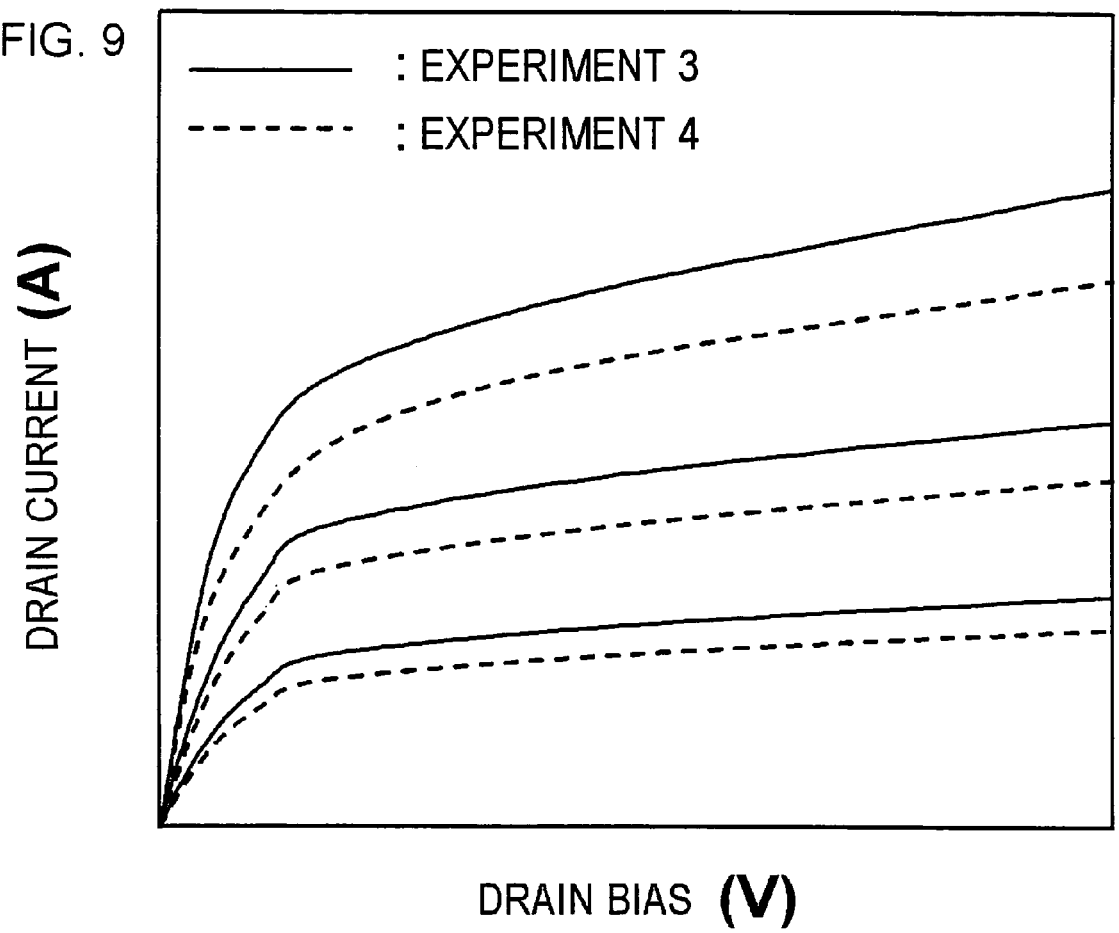
FIG. 9 is a graph, showing a relationship of the drain electrical voltage with the drain current of n-type MOSFETs in examples.

Relationship of the drain bias (V) with the drain current (A) was investigated for n-type MOSFETs obtained in example 3 and example 4. FIG. 9 is a graph, showing a relationship of the drain bias (V) and the drain current (A) of the n-type MOSFETs, which were obtained in example 3 and example 4. According to FIG. 9, it can be seen that the electrical voltage-current characteristics of the n-type MOSFET 102 obtained in example 3 is improved, as compared with the n-type MOSFET obtained in example 4.

In addition, the drain current in the n-type MOSFET obtained in example 5 is lower than that of the n-type MOSFET of example 4 under the condition of applying the same drain bias voltage, and further, the threshold voltage is considerably low, due to an absence the FLA process. It can be understood from the results that the characteristics of the n-type MOSFET for the use as the transistor can be considerably improved by conducting the activation process via the spike RTA, even if the same ion implantation condition is employed. It can be considered that this is because the activation process was conducted via the spike RTA, in addition to conducting the defect-eliminating process via the FLA, so that the doped impurity was suitably diffused while eliminating the defect from the silicon substrate 101, as the synergistic effect thereof.

While the preferred embodiments of the present invention have been described above in reference to the annexed figures, it should be understood that the disclosures above are presented for the purpose of illustrating the present invention, and various configurations other than the above-described configurations can also be adopted.

For example, the earliest heating process after the process for forming the halo region is the process for forming the side wall insulating film in the above described illustrations. The first heating process after the process for forming the extension region is also the process for forming the side wall insulating film. Thus, the FLA process (S103) is conducted just after the process for forming the extension region (S102) in FIG. 4. On the contrary, in the case of the manufacturing process including a heat-treatment process after forming the halo region (S101) and before forming the extension region (S102), an additional FLA process may be conducted before the heat-treatment process. Having such configuration, the lattice defect created in the ion implantation in the process of forming the halo region can be eliminated before the heat treatment process, so that the diffusion of the impurity doped into the halo region can be inhibited.

While illustrations of the cases that the earliest heating process after the ion implantation is the heating process in the process for forming the side wall insulating film 107 or activation-annealing process (S106) have been made in the above described descriptions, the FLA process can also be equally conducted before the heating process even if the earliest heating process thereafter is a process except these processes.

Further, $SiO_2$ film may be employed as the gate insulating film 103, in place of SiON film, in the above illustrations. Further, an insulating film having higher specific dielectric constant than that of $SiO_2$ film (high-k film) may also be employed, so that the physical film thickness be increased while maintaining the dielectric properties.

It is apparent that the present invention is not limited to the above embodiment, that may be modified and changed without departing from the scope and spirit of the invention.

What is claimed is:

1. A method for manufacturing a field effect transistor, comprising:
    forming a gate electrode on an element formation surface of a semiconductor substrate and providing a halo region and an extension region in regions of said semiconductor substrate being in vicinity of said gate electrode;
    providing a source/drain region in said semiconductor substrate, after said providing the halo region and the extension region; and
    activating an impurity contained in an impurity-implanted region by heating said semiconductor substrate via a spike rapid thermal annealing (RTA), after said providing the source/drain region,
    wherein said providing the halo region and the extension region includes a first ion implantation process that comprises ion-implanting a first impurity having a first conductivity type into said semiconductor substrate, and a first flash lamp annealing process that comprises flash lamp annealing said semiconductor substrate after said first ion implantation process, and
    wherein said providing the source/drain region includes a second ion implantation process that comprises ion-implanting a second impurity having said first conductivity type into said semiconductor substrate after said first flash lamp annealing process, and a second flash lamp annealing process that comprises flash lamp annealing said semiconductor substrate after said second ion implantation process.

2. The method according to claim 1, wherein said activating the impurity contained in the impurity-implanted region by heating the semiconductor substrate via the spike RTA includes elevating a temperature of said element formation surface at a rate of equal to or higher than 150 degree C./sec.

3. The method according to claim 1, wherein said activating the impurity contained in the impurity-implanted region by heating the semiconductor substrate via the spike RTA includes heating said element formation surface to a temperature of equal to or higher than 1,000 degree C.

4. The method according to claim 1, wherein said providing the halo region and the extension region comprises ion-implanting an impurity having a second conductivity type into said semiconductor substrate before said first ion implantation process, and said activating the impurity contained in the impurity-implanted region by heating the semiconductor substrate via the spike RTA includes activating the impurity having said first conductivity type and the impurity having said second conductivity type.

5. The method according to claim 2, wherein said providing the halo region and the extension region comprises ion-implanting an impurity having a second conductivity type into said semiconductor substrate before said first ion implantation process, and said activating the impurity contained in the impurity-implanted region by heating the semiconductor substrate via the spike RTA includes activating the impurity having said first conductivity type and the impurity having said second conductivity type.

6. The method according to claim 3, wherein said providing the halo region and the extension region comprises ion-implanting an impurity having a second conductivity type into said semiconductor substrate before said first ion implantation process, and said activating the impurity contained in the impurity-implanted region by heating the semiconductor substrate via the spike RTA includes activating the impurity having said first conductivity type and the impurity having said second conductivity type.

7. The method according to claim 1, further comprising: after said activating the impurity, providing a silicide layer on an upper portion of said gate electrode and on an upper portion of said source/drain region.

8. The method according to claim 2, further comprising: after said activating the impurity, providing a silicide layer on an upper portion of said gate electrode and on an upper portion of said source/drain region.

9. The method according to claim 3, further comprising: after said activating the impurity, providing a silicide layer on an upper portion of said gate electrode and on an upper portion of said source/drain region.

10. The method according to claim 4, further comprising: after said activating the impurity, providing a silicide layer on an upper portion of said gate electrode and on an upper portion of said source/drain region.

* * * * *